US008022759B2

(12) United States Patent
Lejon et al.

(10) Patent No.: US 8,022,759 B2
(45) Date of Patent: Sep. 20, 2011

(54) DYNAMIC RANGE IMPROVEMENTS OF LOAD MODULATED AMPLIFIERS

(75) Inventors: Thomas Lejon, Vallentuna (SE); Leonard Rexberg, Hasselby (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 370 days.

(21) Appl. No.: 12/447,865

(22) PCT Filed: Nov. 1, 2006

(86) PCT No.: PCT/SE2006/050447
§ 371 (c)(1),
(2), (4) Date: Apr. 29, 2009

(87) PCT Pub. No.: WO2008/054275
PCT Pub. Date: May 8, 2008

(65) Prior Publication Data
US 2011/0148518 A1   Jun. 23, 2011

(51) Int. Cl.
*H03F 3/68* (2006.01)
(52) U.S. Cl. .................................. 330/124 R; 330/136
(58) Field of Classification Search .............. 330/124 R, 330/295, 129, 136
See application file for complete search history.

(56) References Cited

U.S. PATENT DOCUMENTS

| 6,078,253 | A  | * | 6/2000 | Fowler | 340/501 |
| 7,421,255 | B2 | * | 9/2008 | Inamori et al. | 455/127.2 |
| 7,444,123 | B2 | * | 10/2008 | Yamawaki et al. | 455/127.2 |
| 2002/0008574 | A1 | | 1/2002 | Mathe et al. | |
| 2005/0110568 | A1 | | 5/2005 | Robinson et al. | |
| 2005/0280466 | A1 | | 12/2005 | Gailus et al. | |
| 2006/0119428 | A1 | | 6/2006 | Lee et al. | |

FOREIGN PATENT DOCUMENTS

| EP | 1 492 227 A1 | 12/2004 |
| EP | 1 492 228 A1 | 12/2004 |
| WO | WO 2004/023647 A1 | 3/2004 |
| WO | WO 2005/031966 A1 | 4/2005 |

OTHER PUBLICATIONS

Supplementary European Search Report, PCT Application No. PCT/SE2006/050447, Nov. 5, 2010.
International Search Report dated Jun. 13, 2007 (4 pages).
International Preliminary Report on Patentability dated Jan. 30, 2009 (6 pages).
Rembold et al., "CLIER—combination of LINC and EER method", Electronics Letters, Aug. 3, 2006, vol. 42, No. 16, AN 9125509, 2 pages.
Mann et al., "A Hybrid Cartesian Loop and Envelope Modulated Pa Linear Transmitter Architecture", the 14th IEEE 2003 International Symposium on Personal, Indoor and Mobile Radio Communication Proceedings, pp. 2721-2725.

* cited by examiner

*Primary Examiner* — Henry Choe
(74) *Attorney, Agent, or Firm* — Myers Bigel Sibley & Sajovec, P.A.

(57) ABSTRACT

The present invention relates to methods and devices to control and operate the functionality of a power amplifier system (100) capable of operating in at least three differential amplification modes. The drive signal's amplitude envelope controls an integrated switch network (104; 105, 106) that routes both the signal envelope and signal phase to different modulation blocks (111, 112: 109, 110: 115). Depending on the envelope strength, the operational mode of the amplifier system is possible to alter to best serve the signal statistics to provide the highest overall power efficiency.

18 Claims, 12 Drawing Sheets

DYNAMIC RANGE IMPROVEMENTS OF LOAD MODULATED AMPLIFIERS

TECHNICAL FIELD OF THE INVENTION

The present invention relates generally to power amplifiers and amplifying methods, and more specifically to high efficiency power amplifiers.

DESCRIPTION OF RELATED ART

In radio transmitters for broadcast, cellular and satellite systems the power amplifier in the transmitter has to be very linear in addition to being able to simultaneously amplify many radio channels (i.e. frequencies) spread across a wide bandwidth. High linearity is required since nonlinear amplifiers would cause leakage of interfering signal energy between channels and distortion within each channel.

In the wireless communication industry, a premium is placed on the ability to amplify wide bandwidth signals. e.g. spread spectrum signals, in highly efficient manner. To limit the size of the DC power supply and cooling equipment in a radio base station, it is essential to keep a high overall power efficiency. Various attempts have been made to address this problem, however it remains difficult to design a high efficiency power amplifier system that is at the same time also able to linearly amplify wide bandwidth signals.

One such system is the Feed forward amplification system, in which the output signal from the amplifier stage is compared to the input signal to be able to determine the difference-signal. To outbalance the non-desired distortion components due to non-linear amplification, said difference-signal is amplified to a suitable amount and added in reversed phase to the output signal from the power amplifier.

In a pre-distortion amplifier system however, the input signal first passes a non-linear pre-distorter, which is an inverse non-linear function to the transfer function of the power stage. Thus, the pre-distortion of the input signal will automatically compensate for the distortion generated by the power stage. In an adaptive pre-distortion system, correction values are stored in a look-up table arrangement of which the output is due to the incoming vector amplitude and the output signals amplitude and phase.

Another known method and system for power amplifying is EER (Envelope Elimination and Restoration). The method is to determine the envelope of the input signal and regenerate it on the output by means of a modulating step. The amplifier operates with constant gain and output amplitude.

Further, another known system and method is called Envelope Tracking. By this, the output signal is compared to the input drive signal for generating an amplifier control signal. Said signal controls the gain of the system and compensates for deviations. The system comprises at least two amplifier stages, which are operating according to a linear function.

Doherty is another method for power amplifying a drive signal. A Doherty system comprises a linear class A amplifier and a non-linear, high efficiency amplifier, e.g. a class C amplifier. The peak power is received by the non-linear amplifier.

Polar loop and Cartesian loop are two other known methods and systems used in power output stages.

The Polar loop system involves separate control of amplitude and phase. The actual value of the amplitude of the drive signal and the desired value are compared in a differential stage that is capable of modulating the RF output signal. In a Phase-Locked Loop (PLL) comprising a VCO (Voltage-Controlled Oscillator) and phase detector the actual value of the phase of the drive signal and the desired value compared and is used for controlling the phase.

The Cartesian loop system comprises a Cartesian loop. This system is operated with the rectangular component I and Q vectors (In-phase and Quadrature-phase). The system is a feedback system wherein the output signal is separated in the I and Q output vectors, which are compared to the input I and Q vectors, respectively.

Another system, which is promising for the future, is the Sigma-Delta-modulation system for modulation of a class E amplifier or a class F amplifier.

In radio transmitter stations for cellular systems, amplifiers in class A and B are commonly used in combination with LINC (LINC, Linear Amplification using Nonlinear Components) or Chireix outphasing methods providing high linearity and efficiency, and wide bandwidth.

The outphasing method, resolves an envelope-modulated bandpass waveform of the drive signal in a signal component separator into two out-phased constant envelope signals $s_1$ and $s_2$, which are applied to power amplifiers. The outputs of the power amplifiers are combined in a hybrid arrangement recovering the envelope-modulated waveform. The output amplitude of the amplified output signal is a result of the phase shift between the signals $s_1$ and $s_2$. When the signals are in phase, amplitude maximum is achieved and when in anti-phase, a minimum amplitude is achieved. The hybrid combiner is designed for the two constant envelope signals to combine distortion-less into the original signal at an impedance level that is matched to receive maximum output power. Only the coherent parts of the two signals of constant envelope are combined at the output of the hybrid. The efficiency ratio will be reciprocally proportional to the ratio between peak power and mean power. By replacing the impedance load by a compensating reactance network, known as the Chireix method, the region of high efficiency is extended to include lower output power levels.

LINC and Chireix networks are sensitive systems that fits well with unbalanced amplifier like class A and B amplifiers.

It is also known in prior art to combine different amplification techniques. From the U.S. patent publication 2005/0280466 A1 an amplification system comprising a combination of Chireix and Doherty techniques is already known. Doherty is used in the upper power dynamic, referred to as the Load Modulation Region. In the region below load modulation region, outphasing with Chireix network is used for increasing the efficiency in said lower region. Both in Doherty and Chireix, the amplifiers are utilized as voltage generators. In the known system, said amplifiers are combined by an impedance inverter. When the Doherty amplifiers are active, the main transistor of said configuration will be influenced by an impedance increase and, therefore, the available power will decrease. In the Chireix case, both amplifiers are influenced by the impedance increase as the phase difference between the two branches increases reducing the available power while the delivered power decreases due to outphasing. In both Doherty and Chireix, the efficiency is maintained. In one embodiment of the known system, the output voltage to block 330, i.e. Doherty block, is controlled according to the described EER method.

The known Chireix/Doherty combination has a number of drawbacks. Signal combining networks are not trivial to implement and it is especially complicated to attain the desired operation of the amplifier system when utilizing Chireix networks. Further, the efficiency of Chireix is sensitive for parasitic disturbances and decreases rapidly due to parasitic components in the transistors of the system.

A common problem for the above listed systems and methods is their limited capability to linearly amplify wide bandwidth signals. Further, it is desirable to avoid said drawbacks of the signal combining network and facilitate implementation.

SUMMARY

An object of the present invention is to address above stated problem to linearly amplify wide bandwidth signals and at the same time with a high power efficiency.

One idea according to the present invention is to control and operate the functionality of a power amplifier system capable of operating in at least three differential amplification modes. The drive signal envelope controls an integrated switch network that routes both the signal envelope and signal phase to two different modulation blocks.

One idea of the architecture of the present invention is basically to be able to use amplifiers in at least three different modes wherever the power efficiency might be strongest. Depending on the envelope strength, the operational mode of the amplifier system is possible to alter to best serve the signal statistics to provide the highest overall power efficiency.

The above described problems may be solved according to the present invented method for power amplifying an input drive signal to a power amplification system comprising at least three different power amplification modes, wherein each amplification mode is dedicated to operate within a pre-determined amplification interval. The method is comprising the step of determining the momentary envelope value of the input drive signal, and the step of switching amplification mode to one of the at least three amplification modes depending on the determined momentary envelope value.

Further, the above described problems may be solved by means of the present invented amplifier system for power amplifying an input drive signal to the system, which system is arranged to operate in at least three different power amplification modes. Each amplification mode is dedicated to operate within a pre-determined amplification interval. The present system comprises:
- determining device for determining the momentary envelope value of the input drive signal; and
- switching amplification mode device for switching to one of the at least three amplification modes depending on the determined momentary envelope value received from the determining means.

The present invention may be included in a radio base station in a mobile radio telecommunication network, wherein said base station comprises an amplifier system according to the invention and the different embodiments.

The described problems are solved by means of an invented switching amplification mode device in a power amplifying system for power amplifying an input drive signal to the system. The system is arranged to operate in at least three different power amplification modes, wherein each amplification mode is dedicated to operate within a pre-determined amplification interval. Said system is comprising a determining device for determining the momentary envelope value of the input drive signal, wherein the switching amplification mode device is arranged to switch the system to operate in one of the at least three amplification modes depending on the momentary envelope value received from the determining device.

Different embodiments of the invented method, amplifier system, radio base station and switching amplification mode device are described in the detailed description hereafter.

This is a technique suitable for amplifiers that work poorly when the input signal is backed off like the Current mode Class D, Class B, Class C, Class D, Class E, Class E/F and Class F amplifiers. For example by using load modulation in combination with outphasing and EER, the efficiency can be maintained over the output power range where the impedance tuner can track the optimum impedance for the amplifier at each power level. Outside the tunable area the efficiency drops quickly but the dynamic range of the system is increased so that highly dynamic signals like the UMTS signals still can be amplified linearly into the load.

BRIEF DESCRIPTION OF THE DRAWINGS

The invention will in the following be described in more detail with reference to enclosed drawings, wherein:

FIG. 1b is the envelope signal E corresponding to the input signal, drive signal, $S_{in}(t)$ illustrated in FIG. 1a.

DETAILED DESCRIPTION OF PREFERRED EMBODIMENTS

The present invention will be described more fully hereinafter with reference to the accompanying drawings, in which preferred embodiments of the invention are shown. This invention may, however, be embodied in many different forms and should not be construed as limited to the embodiments set forth herein: rather, these embodiments are provided so that this disclosure will be thorough and complete, and will fully convey the scope of the invention to those skilled in the art.

Figure 1A:
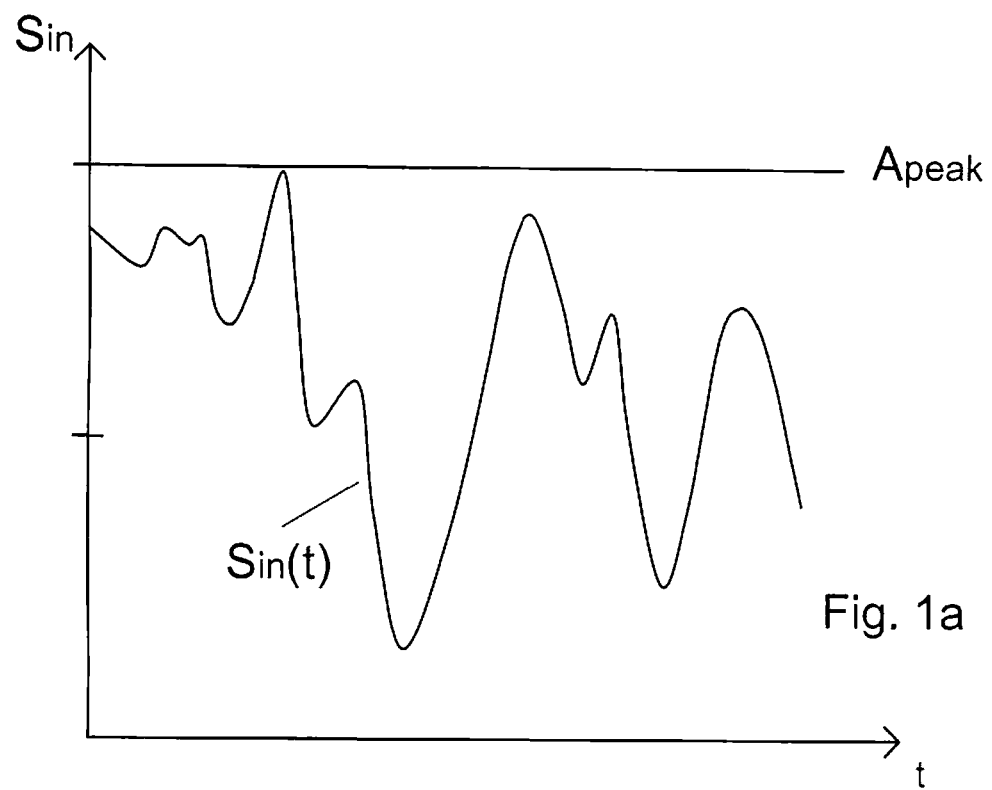
FIG. 1a is a possible variation over time of an input signal, drive signal, $S_{in}(t)$ to a power amplification system according to the present invention illustrated.
Figure 1B:
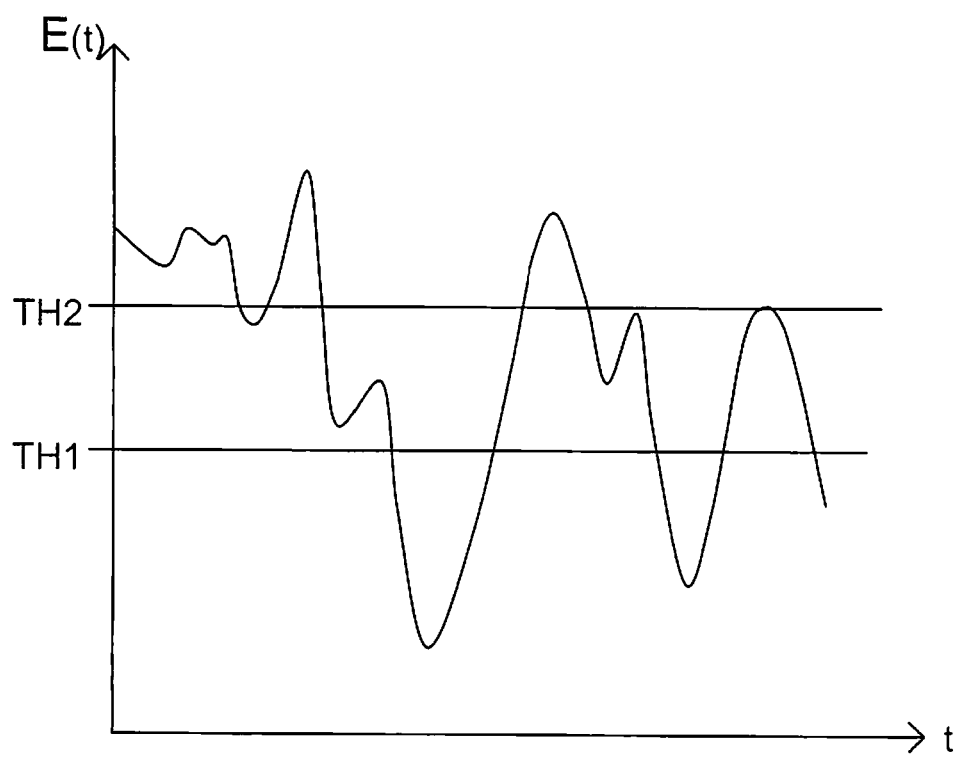

In FIG. 1a is a possible variation over time of an input signal, drive signal, $S_{in}(t)$ to a power amplification system according to the present invention illustrated. One idea according to the present invention is to control the functionality of a power amplifier system capable of operating in at least three different amplification modes. For this purpose, an envelope signal is determined. The envelope E of the drive signal controls an integrated switch network that routes both the signal envelope and signal phase to two different modulation blocks. If the power amplifier system is to be operated in three different amplification modes, two different predetermined threshold values TH1 and TH2, where TH2>TH1, are used. The envelope signal and said threshold values are illustrated in FIG. 1b. As an example, when the signal envelope E is larger than some pre-determined threshold, i.e. envelope value E is larger than threshold TH2, the operation is set to Dynamic Load (modulation) mode. If the signal envelope E is determined to be between the two thresholds, i.e. TH1<E<TH2, the operation is set to EER mode. Finally, if the envelope E is measured to be lower than TH1, i.e. 0<E<TH1, outphasing mode is set as operation mode of the amplifier system. Thus, three mode operation intervals may be defined: the first mode operation interval, e.g. [0, TH1] (i.e. 0≦E≦TH1) where the system is defined to operate in the first amplification mode if E is equal to TH1, the second amplification mode interval, e.g. ]TH1,TH2] (i.e. TH1<E≦TH2) where the system is defined to operate in the first amplification mode if E is equal to TH1 and in the second mode if E is equal to TH2, and finally the third amplification mode interval if E is greater than TH2. e.g. ]TH2, ∞[ (i.e. TH2<E<∞). It is obvious to a person skilled in the art that it is necessary to decide whether a system should operate in the first or second mode if E is equal to TH1, or in the second or third mode if E equals TH2. However, such a decision is open for any choice of mode and one choice is not better than another. The system will operate equally well.

Figure 2:
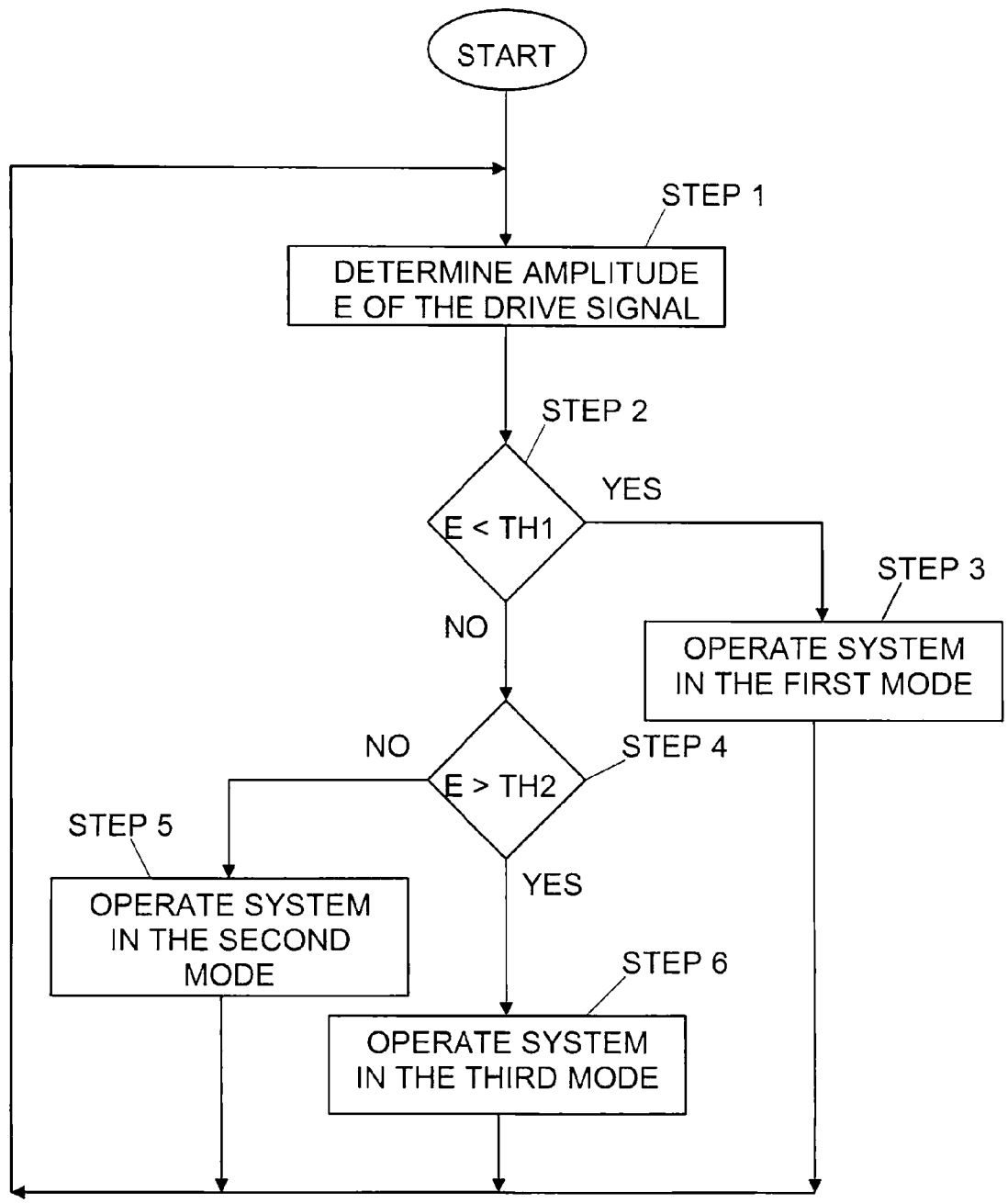
FIG. 2 is a flowchart diagram illustrating the method according to the present invention.

More generally, the method according to the present invention is illustrated in a flowchart of FIG. 2. The method is illustrated as an endless loop, wherein the different steps are performed depending on the envelope measure value and the threshold values that is preset before start. Threshold value TH1 is set to be less than threshold value TH2.

In the first step, Step 1, the momentary value of the envelope is continuously determined, by means (102 in FIG. 3) for determining the momentary envelope value, hereafter denoted E or amplitude value E, of the drive signal fed to the power amplifier system. The amplitude value E is a function of the drive signal. In the next step, Step 2, the determined amplitude E is compared in a means (104 in FIG. 3) for switching amplification mode. Said means may have a control input for receiving an amplitude value indication, an analogue signal or a digital value indicating the momentary amplitude E. Said value E is compared to the lowest of the preset threshold values, TH1. If the condition E<TH1 is true, indicated as "yes" in FIG. 2, the amplifier system is set to operate in the first mode. The system will remain in this mode, or state, as long as E does not exceeds TH1. However, when E exceeds TH1, the condition is not true any longer, indicated as "no" in FIG. 1, and the device for switching mode will switch to either of the two other amplification modes, the second or the third, depending on whether E is exceeding TH2 or not. Therefore, in Step 4, E is compared to TH2. If E doesn't exceed TH2, the amplifier system is controlled and set to operate in the second mode, Step 5, and the system will remain there as long as the comparison condition in step 4 is not true (NO), or E decreases to a value less than TH1, or if E increases to a value exceeding TH2. If E decreases to a measure less than TH1, the system will switch to operate in the first mode, but if E increases to a value higher than TH2, the comparison condition E>TH2 is true (yes), the amplifier system is controlled and set to operate in the third mode, Step 5, and the system will remain there as long as the comparison condition in Step 4 is true. When the condition of Step 4 is not true any longer, the system amplification mode will be switched to either the first mode due to the fact that E<TH1 in Step 2, or to the second mode due to the fact that E does not exceed TH2 in Step 4, but exceeds TH1 in Step 2.

Regardless which amplification mode that the amplifier system is set to operate, the method loop will be continuously run through causing a continuous determination and measurement of the drive signal envelope in Step 1 and mode switch will only be performed when E is determined to switch amplification mode interval.

In the following described preferred embodiment, the three different modes are the outphasing mode, the Envelope Elimination and Restoration (EER) mode and the Dynamic Load modulation (DL) mode.

Figure 3:
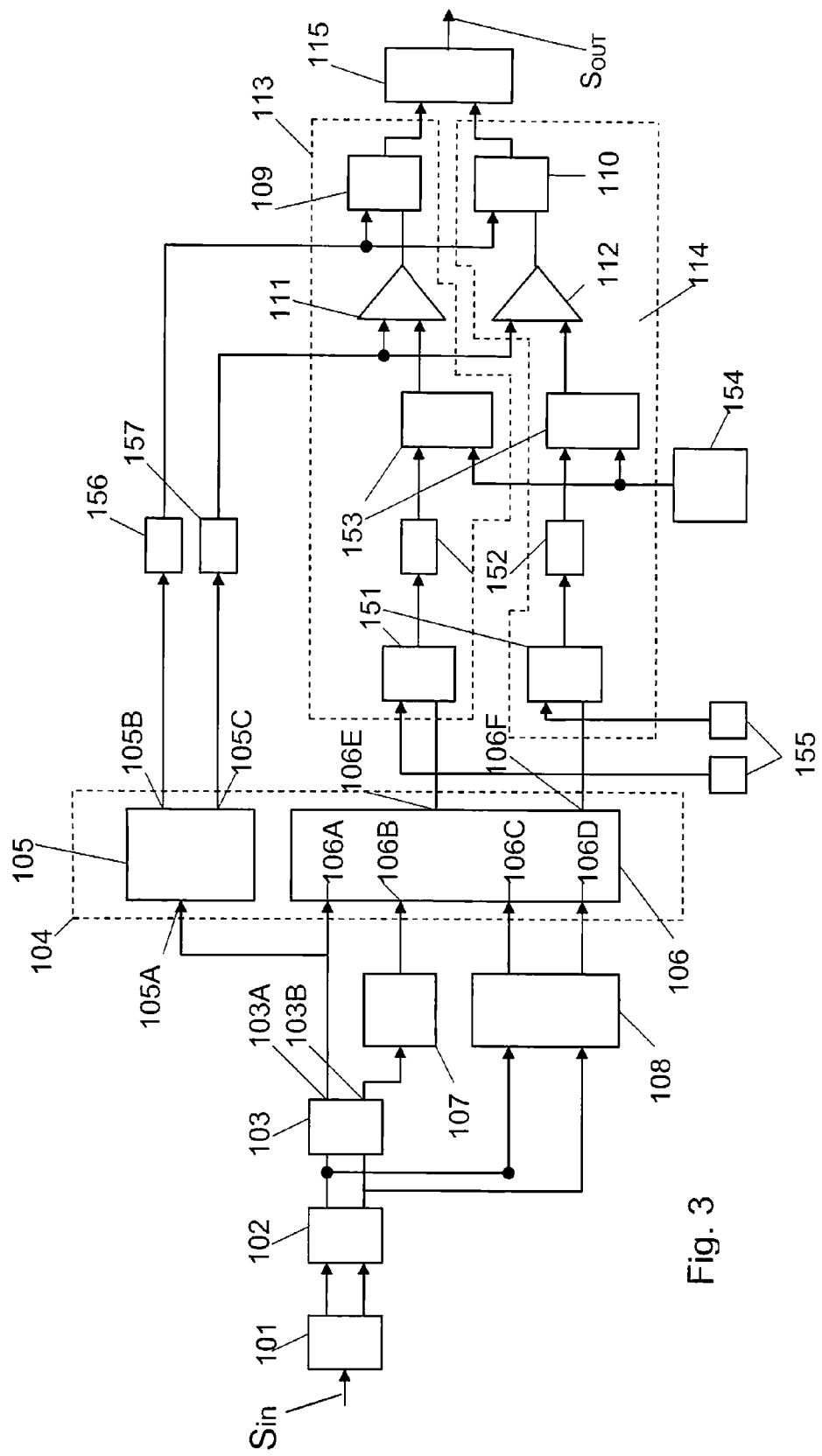
FIG. 3 shows a block diagram of a preferred embodiment of a power amplifier system according to present invention.

A preferred embodiment of the amplifier system 100 according to the present invention will now be presented with reference to FIG. 3. The amplifier system is illustrated as a radio architecture for use in a radio base transmitter of a mobile radio telecommunication network. An input drive signal $S_{in}$ to be amplified may according to already known methods be transformed into I- and Q-vector pairs in a baseband generator 101. Further, said I- and Q-vector pair are converted into polar coordinates representing the resulting amplitude and phase of the vector sum of said pair by the IQ-to-Amplitude/phase converter block 102, which is a well-known process to a person skilled in the art. Said resulting amplitude, i.e. the envelope signal E(t) and phase θ is separately fed to a digital pre-distortion block, DPD block 103.

Said DPD block 103 is used for linearization of the power amplifiers if necessary, and therefore optional. It is more and more common that the linearization is performed in the digital domain. Instead of using RF-components, or even in some cases low frequency analogue components to accomplish pre-distortion, one is more inclined to make use of rapidly emerging high-speed signal processors such as Digital Signal Processors, DSP, and Field Programmable Gate Array, FPGA, which can be further integrated into an ASIC. It not only lets you implement more complex DPD solutions, it also turns up to be a cost-saver for the overall radio implementation. It can be implemented as a look-up table (LUT) with the envelope of the signal at base band as the only entry index. The signal at base band will then be multiplied by this table output using both amplitude and phase. Memory effects can be taken care of by a similar method only requiring one or several similar instances of the LUT architecture in parallel.

The DPD functional block 103 may be placed either before the IQ-to-Amplitude/phase conversion, or optionally after it. In either case, the pre-distortion will be a function of the envelope only, modifying the amplitude of the signal, or possibly also the phase component of it. Digital Pre-Distortion is a well-known technique from earlier published documentation, e.g. the international published application No. WO2004/086607 A1, and the U.S. Pat. No. 6,545,535. By means of what is known from above mentioned documents, a person skilled in the art will be able to design a DPD functional block 103.

To be able to switch between the different amplification modes, the outphasing mode, the Envelope Elimination and Restoration (EER) mode and the Dynamic Load (DL) modulation mode, an amplification mode switching block 104 is introduced in the amplifier system according to the invention.

The mode switching device 104, constituting the switching means for switching amplification mode, is in this embodiment divided into two separate switching blocks, but it is possible to be implemented and regarded as one block only or several separated blocks. According to the illustrated embodiment, the mode switching block 104 is separated into an EER/Dynamic Load mode Switching block (EDLS) 105 and a Phase modulation/Outphasing mode Switching block (POS) 106, respectively. An implementation of the switching block(-s) will be discussed in more detail with reference to FIGS. 10A-10C, which are schematic block diagrams showing an implementation EDLS 105 and POS 106 of the mode switching block 104 in the three different modes.

The EER/Dynamic Load mode Switching block (EDLS) 105 receives the momentary amplitude value generated by the IQ-to-Amplitude/phase conversion block 102 and DPD block 103 arrangement irrespectively of the individual order of said two blocks. The EDLS 105 is designed to forward the actual amplitude value E in EER mode and DL mode, respectively, but blocks said amplitude value E and forward a predetermined control value, e.g. unit value, in Outphasing mode. The EDLS 105 has one input 105A two output ports 105B and 105C, wherein the first output port 105B is active during the DL mode and the second output port 105C is active during the EER mode. During the Outphasing mode, both outputs are active forwarding said control value, e.g. unit value, which facilitates the amplifier system to be operated in said mode.

The Phase modulation/Outphasing mode Switching block (POS) 106 has four input ports 106A-106D and two output ports 106E-106F.

Figure 10A:
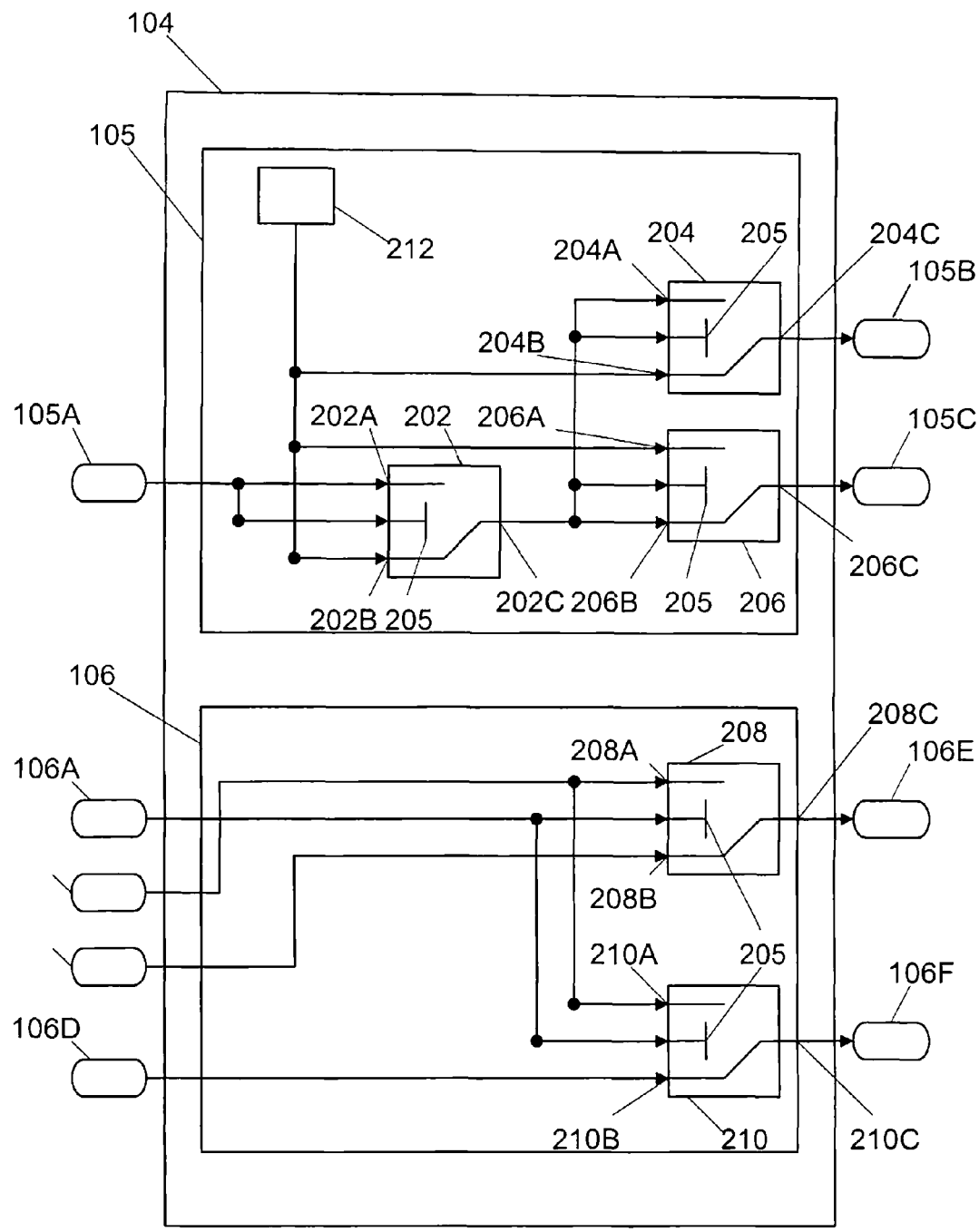
FIG. 10A is a block diagram illustrating a mode switching device of the present invention when the power amplifier system is operating in outphasing mode.
Figure 10B:
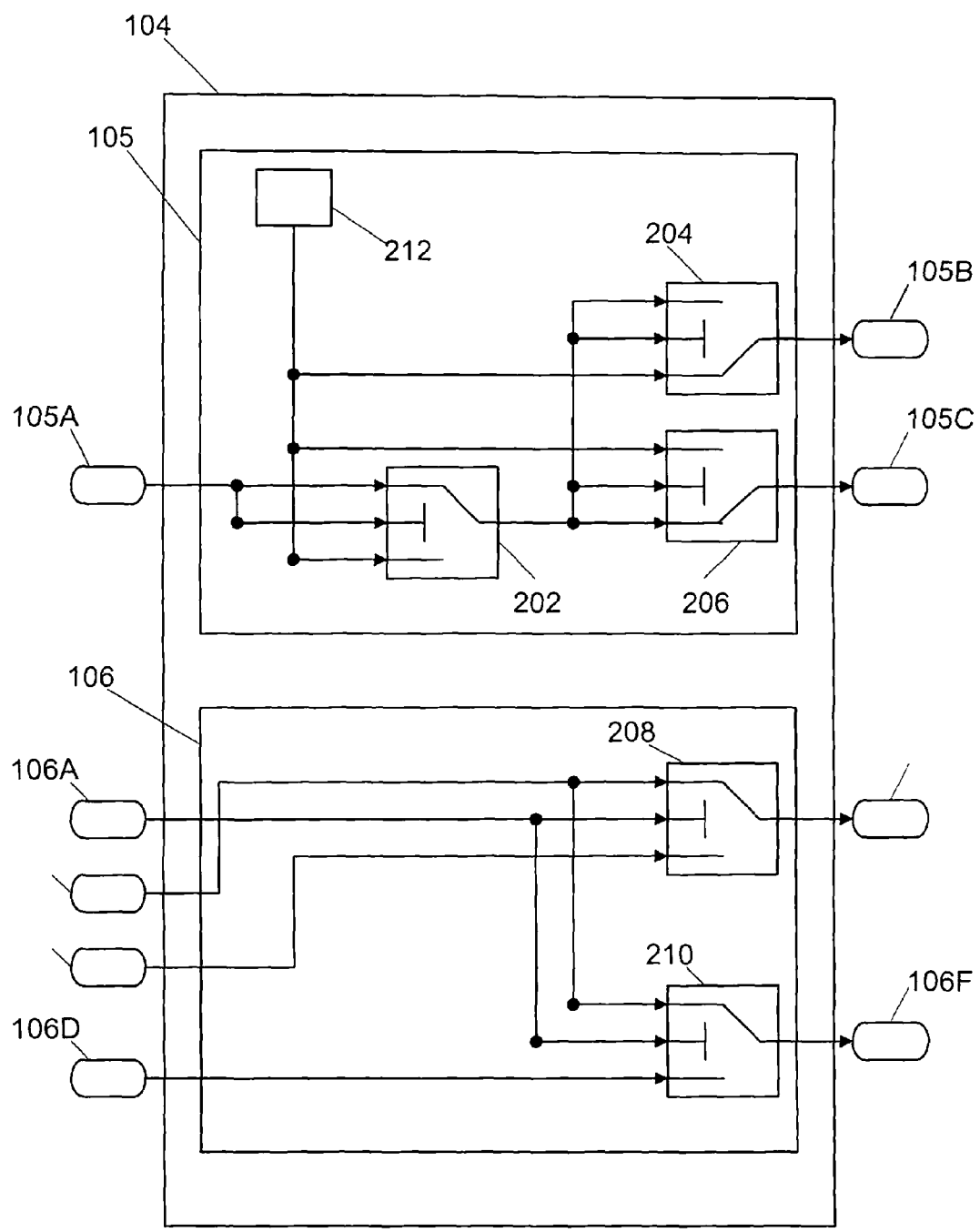
FIG. 10B is a block diagram illustrating a mode switching device of the present invention when the power amplifier system is operating in EER mode.
Figure 10C:
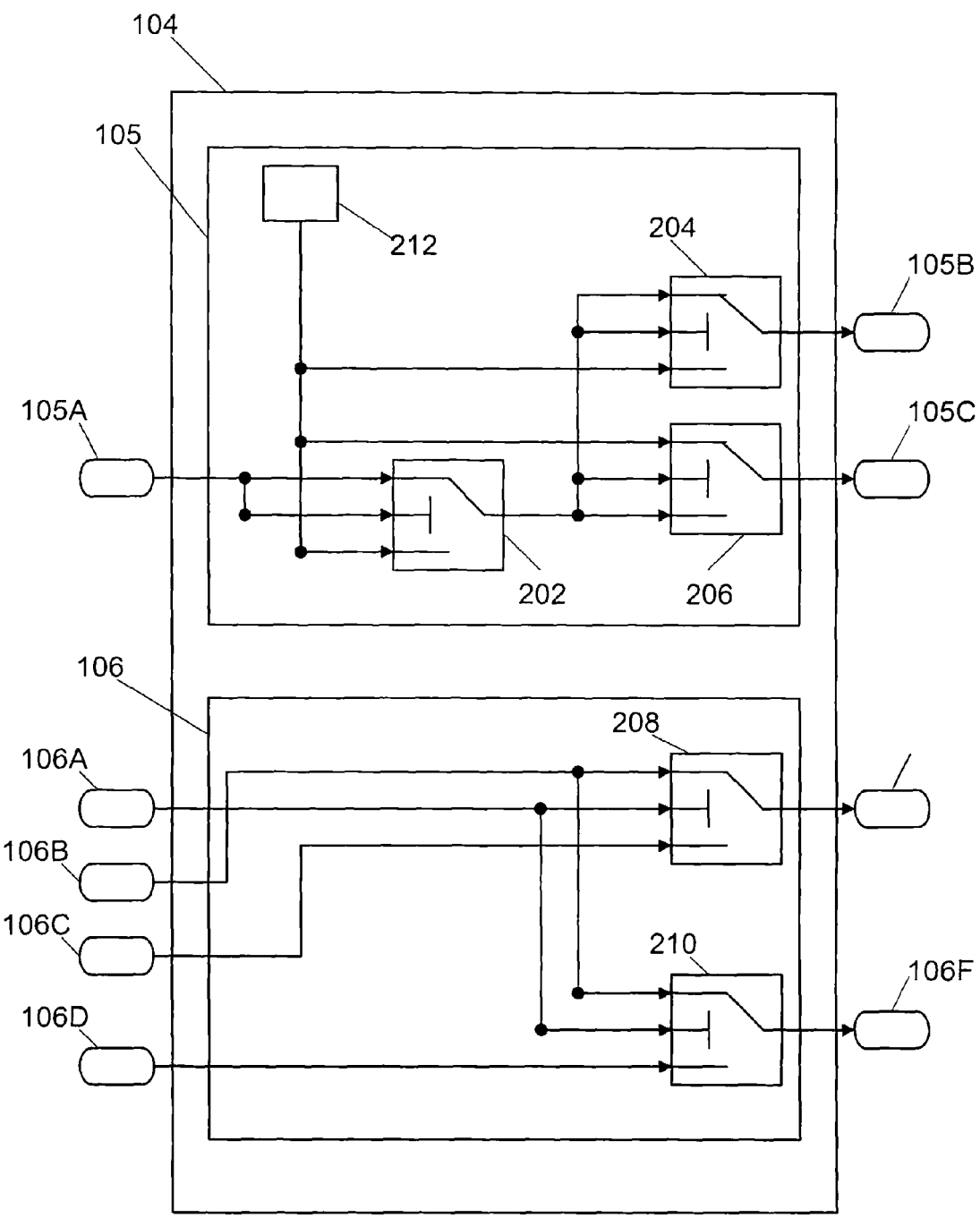
FIG. 10C is a block diagram illustrating a mode switching device of the present invention when the power amplifier system is operating in DL mode.

An implementation of the switching block(-s) is illustrated in FIGS. 10A-10C, which are schematic block diagrams showing an implementation of the EDLS 105 and POS 106 of the mode switching block 104 (see FIG. 3) in the three different modes, respectively, according to the invented method as described in FIG. 2.

The momentary amplitude value generated by the IQ-to-Amplitude/phase conversion block and DPD block arrangement 102-103 irrespective of the individual order of said two blocks is received on the first input port 106A of the POS 106. Thus, both the POS and the EDLS are connected to the output port 103A of the IQ-to-Amplitude/phase conversion block and DPD block arrangement. The second input port 103B is connected to the output of a complex phase modulator 107, which will be described in more detail in connection to FIG. 9. The complex phase modulator 107 generates a complex phase modulation signal θ, corresponding to a phase difference for a desired power amplification level of the PAs 111 and 112, said signal is transferred both to the first output port 106E and the second output port 106F of the POS when the amplifier system is operated in EER mode and DL mode. For achieving operation in the Outphasing mode, the third 106E and fourth input 106F of the POS 106 are connected to a Outphasing split block 108, which design is regarded as known to a person skilled in the art by prior art documentation. The Outphasing principle generally means a method for obtaining amplitude modulation by combining two phase modulated constant amplitude voltages produced by a signal component separating means. In this embodiment, the outphasing split block generates the two constant amplitude signals and which phase difference is a measure of the input amplitude. When the two signals are in phase, a maximal output signal is generated, but a minimal amplitude is generated if the two signal is in counter phase. The two signals from the split block will be separately transferred to the first output and second output, respectively.

As the outputs from EDLS are a digital signal and the devices 109-112 is analogue operating circuits, digital-to-analogue converters DAC 156, 157 is needed for performing the conversion.

The upper switching block, EDLS 105, selects whether the envelope is to be sent to the dynamic load modulation devices 109 and 110, i.e. in DL mode operation, or to be sent to control the gate directly of the power amplifiers 111 and 112 according to EER mode operation. The lower switching block, POS 106, controls if the two outphasing signals in outphasing operation mode shall be sent to the two power amplifiers 111 and 112, or if the phase modulated RF-signal should be sent in equal proportions to the power amplifiers 111, 112 of the amplifier system.

The first output port 106E of the POS 106 is connected to a first power amplifier branch 113, and the second output port 106F is connected to a second power amplifier (PA) branch 114. Each PA branch 113 comprises a power amplifier and a dynamic load device and in the radio architecture design an IQ-modulator step. The output of each PA branch is connected to an adder device 115 that generates an output signal equal to or corresponding to the sum of said PA output signals.

The two branches 113 and 114 are configured and designed in the same way. Therefore, by describing the design and function of one PA branch, both PA branches are regarded as described in detail.

The first output 106E of the POS 106 is connected to the IQ-modulator step of the first PA branch. The IQ-modulator step comprises an IQ-compensator 151, a digital-to-analogue converter 152 and an IQ-modulator 153. Optionally, a limiter may be included directly after and connected to the IQ-modulator. The function of said limiter is to form a square wave on the output as a function of the input signal. Thereby, it will be possible to feed the power amplifier system with square waves.

The IQ-compensator 153 is a complex-valued up-converter design. This implementation involves a simple complex-valued multiplication between the base band IQ-representation with a complex-valued oscillator signal tuned at carrier frequency. As the RF-signal is real, only the real component of the signal is presented to the PA.

As the radio architecture according to state-of-the art is of the form direct up-conversion from complex base band to RF, the IQ-modulator 153 is of analogue form. As such it will suffer from RF impairments and has to be corrected for by an IQ-compensator 151. The IQ-compensator corrects for irregularities at base band such as IQ-leakage and DC leakage. The leakage consists of a cross-coupling effects in the circuits between the I-component and the Q-component of the complex signal. In addition there might be a DC (Direct current) leakage. These leakage quantities have to be calibrated fairly accurately in order to keep the adjacent channel at a low level. The compensation can readily be made at digital base band. However, this IQ-compensation will not be discussed in more detail as it is regarded as not essential for understanding the present invention. By means of a local oscillator 154, it will be possible to control and generate the transmit radio frequency.

The RF-modulated signal is connected to the power amplifier PA of the PA branch. The power amplified signal is connected to a dynamic load device 109. The dynamic load device 109 may be implemented as a controllable impedance tuner or filter. The amplitude control signal, also referred to as the envelope control signal, to the tuner is received from one of the output of the EDLS 105. The dynamic load device 109 is only used in the DL mode for amplitude modulation of the output RF-signal from the PA 111, and is designed to have as little effect as possible during operation in the other two modes. As stated before, the output of the dynamic load device 109, which is the final step of the PA branch, is connected to one of the inputs of the adder device 115. The output of the second parallel PA branch 114 is also connected to the adder 115, and the output signal $S_{OUT}$ is the vector sum of the two output signals received from the first and second PA branches.

The design of the adder device 115 may be an isolated hybrid combiner or a Wilkinson combiner. It is important that the adder device isolates the two branches 113 and 114, respectively, from each other. If the two branches are isolated, the branches will not influence each other and their performance. According to the Chireix method, said branches are not separated from each other. The isolated hybrid combiner or a Wilkinson combiner are well-known to a person skilled in the art of electronic circuit design and the design will therefore not be discussed in more detail.

The architecture of the present invention comprises a pair of amplifiers operated in all three different modes depending on when the power efficiency might be strongest. Depending on the envelope strength, the operational mode of the amplifier system is possible to alter to best serve the signal statistics to provide the highest overall power efficiency. For this purpose two different pre-determined threshold values TH1 and TH2, where TH2>TH1, are used.

In a best mode of the invention, when the signal envelope E is larger than some pre-determined threshold, i.e. envelope value E is larger than threshold TH2, the operation is set to Dynamic Load (modulation) mode. If the signal envelope E is determined to be between the two thresholds, i.e. TH1<abs(E)<TH1, the operation is set to EER mode. Finally, if the envelope E is measured to be lower than TH1, i.e. abs(E)<TH1, outphasing mode is set as operation mode of the amplifier system.

In another embodiment of the invention, when the signal envelope E is larger than some pre-determined threshold, i.e. envelope value E is larger than threshold TH2, the operation is set to EER mode. If the signal envelope E is determined to be between the two thresholds. i.e. TH1<abs(E)<TH1, the operation is set to Dynamic Load (modulation) mode. Outphasing mode is set as operation mode of the amplifier system when the envelope E is measured to be lower than TH1, i.e. abs(E)<TH1.

However, the invention provides the possibility to use more threshold values than two. The invention also provides possibility to operate the amplification system in more than three modes. In such other modes, the system is operated according to a combination of at least two of the stated amplification techniques outphasing, DL or EER. As an example, DL and EER may be used simultaneously in a combination mode.

For the sake of clarity, it must be particularly expressed that the power amplifier system according to the invention is described when incorporated in a radio architecture. In the radio architecture, the IQ-modulator 153 including the Local Oscillator (LO) device 154 and the IQ-compensator 151 including devices 155 is added to the power amplifier system according to the invention. Thus, in the basic invented power amplifier system 100 said devices 151, 153, 154 and 155 is excluded.

The operation of a best mode of the amplifier system in each of the three modes will now be discussed and presented in more detail with reference to FIGS. 4, 5 and 6.

Figure 4:
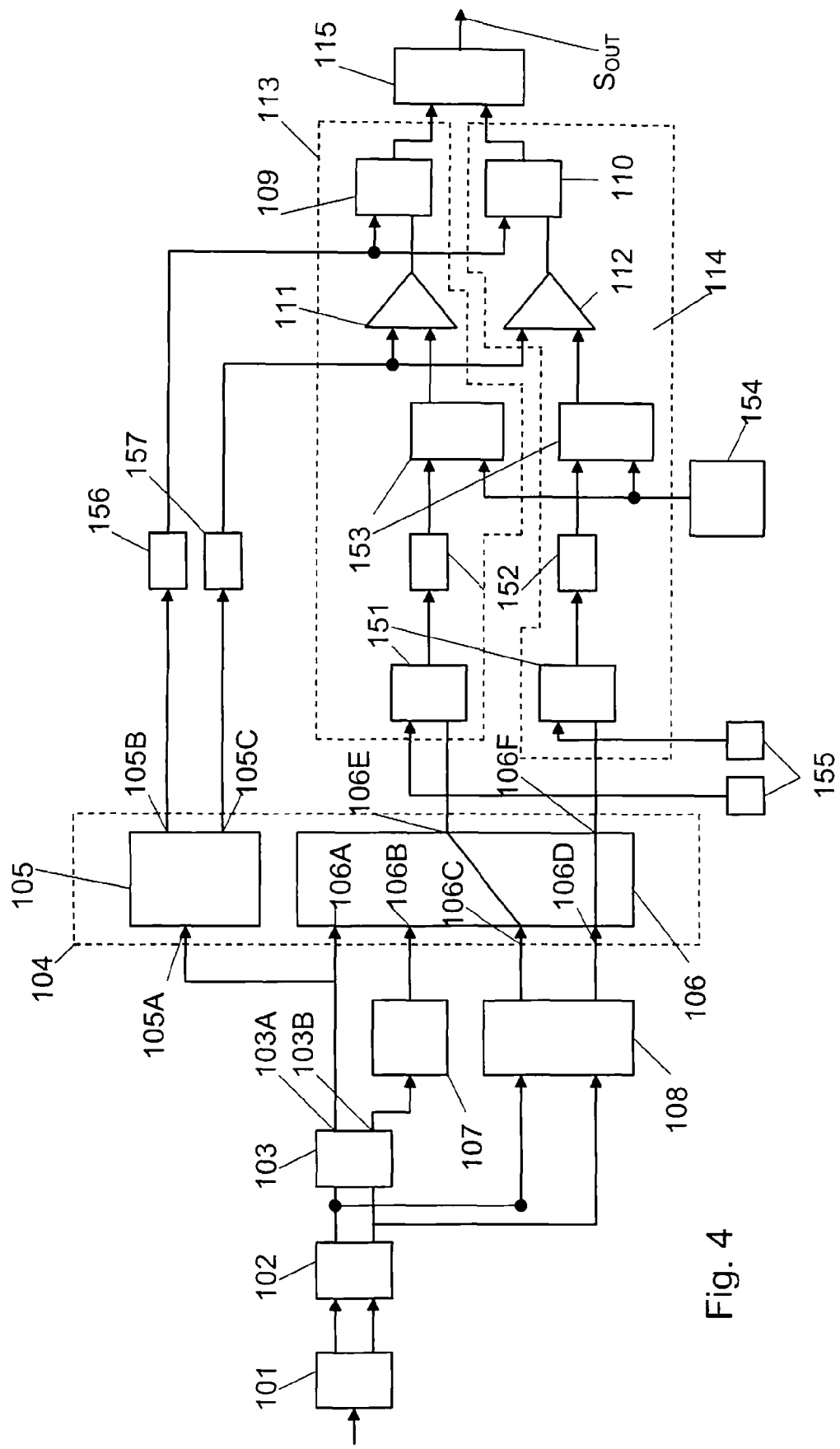
FIG. 4 shows a block diagram illustrating when the power amplifier system in FIG. 2 is operated in outphasing mode.

In FIG. 4, the above presented radio architecture of the power amplifier system 100 according to the invention of FIG. 3 is operated in outphasing mode, i.e. outphasing technique is used.

The outphasing method is well-known and earlier described, e.g. in the patent application publication No. US 2005/0248401 A1, in the patent document No. U.S. Pat. No. 6,825,719 B1, in the patent document U.S. Pat. No. 7,030,714 B2, and in the article "RF power amplifiers for Wireless Communications", by Steve C. Cripps, pp. 240-246, Artech House Publishers, April 1999, ISBN 0890069891. A more detailed description of the outphasing method and architecture seems therefore not necessary.

When the amplification mode switching block 104 receives an amplitude value E within an amplification mode interval wherein outphasing technique is set to be used, said block 104 will connect the two necessary constant envelope signals $S_1$ and $S_2$ provided by the outphasing split block 108, one of the signals to the first PA branch 113 and the other signal to the second PA branch 114.

The object of the Outphasing split block 108 is to present two constant envelope signals so that when added together they reconstruct the original signal with time varying amplitude and phase. The baseband signal, defined as $S_{in}(t)=Re\{I+jQ\}$, is split into an amplitude component and a phase difference part by the IQ-to-Amplitude/phase conversion block 102. The block 108 has one input for said amplitude component and one input for said phase difference part. The constant envelope signals and the two amplifiers 111, 112 ensures that a fully linear amplification of the RF signal is achieved. It is a straightforward matter in the digital domain to split the signal suitable for the outphasing modulated amplifiers 111, 112.

The complex versions of the signals $S_1(t)$ and $S_2(t)$ are:

$$S_1(t)=Re\{e^{j\omega t}\cdot e^{j\phi}\cdot e^{j\cos^{-1}E}\} \text{ and } S_2(t)=Re\{e^{j\omega t}\cdot e^{j\phi}\cdot e^{-j\cos^{-1}E}\}$$

It is readily seen that $S_1(t)$ and $S_2(t)$ are two signals of constant envelope E, phase difference $\phi$, and carrier frequency $\omega$. Now, by simple algebraic manipulations we can extract the amplitude part out of the parenthesis to get it appear as a real quantity in front of the complex signal, in the following manner:

$$S_1(t)+S_2(t)=2\cdot E\cdot Re\{e^{j\omega t}\cdot e^{j\phi}\}$$

As can be easily understood, by extracting the real part of the complex expression above a real expression for an RF-modulated signal having both amplitude and phase variations. An example of such a signal is the WCDMA-signal which is modelled at complex base band by simultaneous amplitude and phase signal. If the output signal from the adder is defined as Y(t), and the gain of both power amplifiers is G, the output $S_{OUT}$ is:

$$S_{OUT}(t)=2\cdot G\cdot E\cdot \cos(\omega t+\phi)$$

The EER (Envelope Elimination and Restoration) method is also well-known and earlier described, e.g. in the patent application publication No. US 2002/0008574 A1, see especially sections [0004]-[0005] and sections [0023]-[0029], and the article "RF power amplifiers for Wireless Communications", by Steve C. Cripps, pp. 246-247, Artech House Publishers, April 1999, ISBN 0890069891. A more detailed description of the EER method and architecture seems therefore not necessary.

Figure 5:
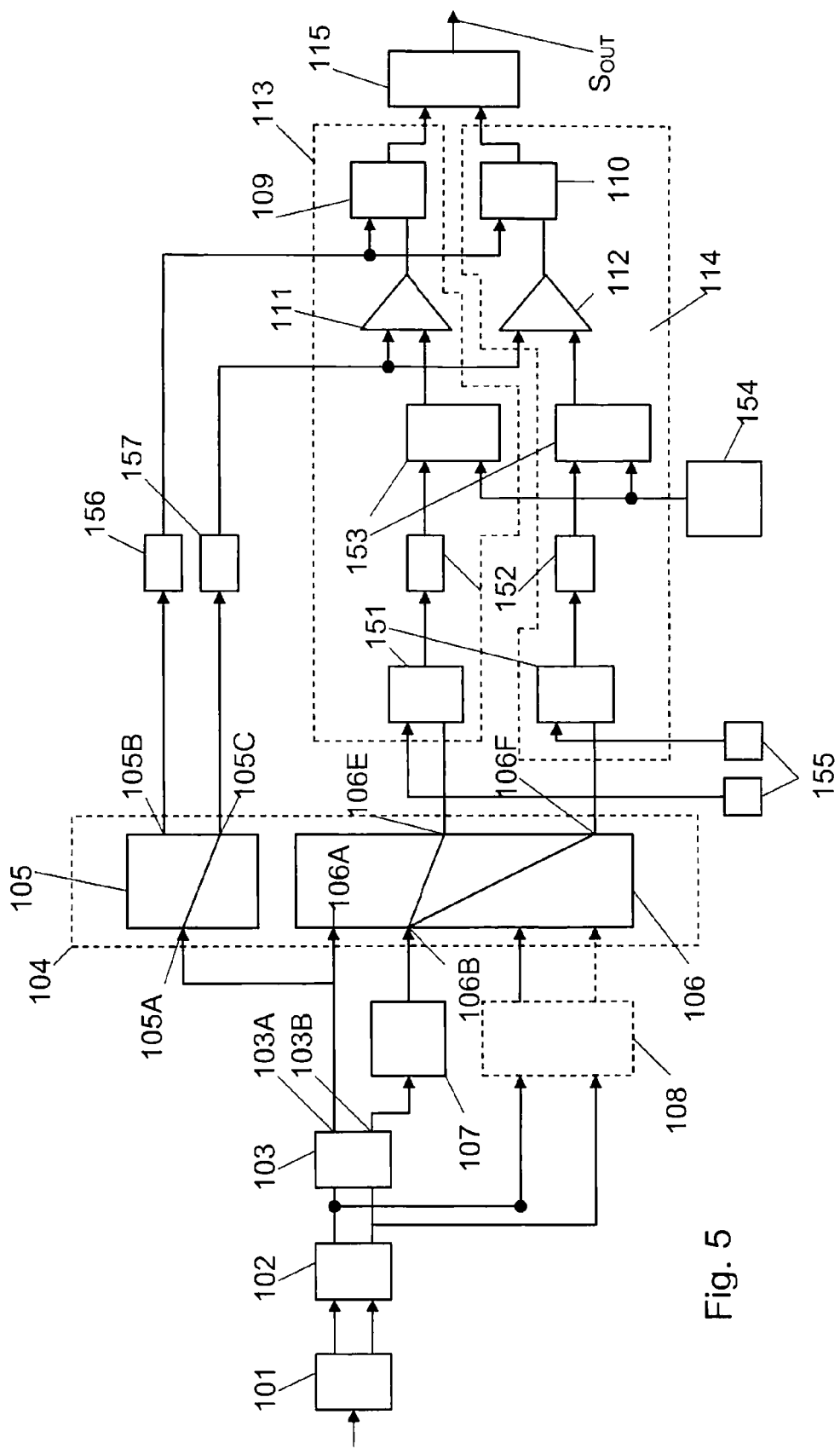
FIG. 5 shows a block diagram illustrating when the power amplifier system in FIG. 2 is operated in EER mode.

In FIG. 5, a preferred embodiment of the invention is illustrated when operated in EER mode.

When the amplification mode switching block 104 receives an amplitude value E within an amplification mode interval wherein EER technique is set to be used, said block 104 will block the two constant envelope signals $S_1$ and $S_2$ provided by the outphasing split block 108.

However, the baseband signal, defined as $S_{in}(t)=Re\{I+jQ\}$, is in the same way as in the outphasing method split into an amplitude component and a phase difference part by the IQ-to-Amplitude/phase conversion block 102. The amplitude component is forwarded by the EDLS 105 and controls the bias of the power amplifiers 111, 112 in the two amplifier branches 113, 114. When the amplifier system 100 is operated in EER mode, the complex phase modulator 107 generates from said phase difference part a complex phase modulation signal that is transferred to the first and second output port of the POS 106 and further introduced in each power amplifier branch 113,114. If the output signal from the adder 115 is defined as $S_{OUT}(t)$, and the gain of both power amplifiers is $G(E(t))$, the output $S_{OUT}$ may be described as:

$$S_{OUT}(t)=2\cdot G(E(t))\cdot Ph(t)=A(t)\cdot Re\{e^{j(\omega t+\phi)}\}=A' \cos(\omega t+\phi),$$

wherein A' is equal to the amplified amplitude modulation coefficient, E(t) is the amplitude component and Ph(t) is the phase component. The complex phase modulator's contribution is identified as $e^{j\phi}$ and the complex up-converter's contribution as $e^{j\omega t}$. Thus, the signal Ph(t) is generated and provided by the complex phase modulator and the complex up-converter.

The DL (Dynamic Load) method is also well-known and earlier described. e.g. in the article "High-Efficiency Linear Amplification by Dynamic Load Modulation" by Frederick H. Raab, 2003 IEEE Met-S Digest, pp. 1717-1720.

Figure 6:
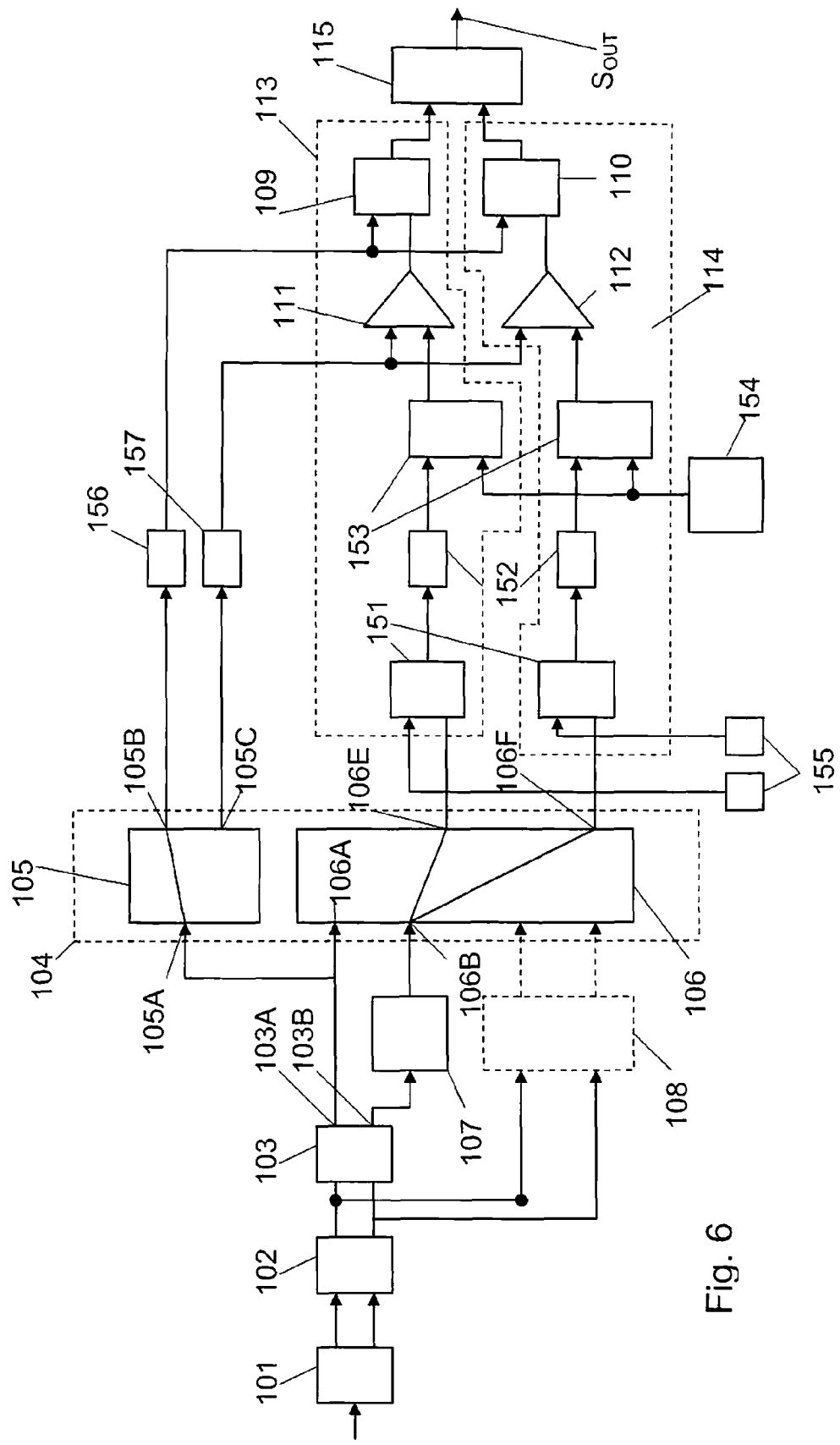
FIG. 6 shows a block diagram illustrating when the power amplifier system in FIG. 2 is operated in Dynamic Load (DL) modulation mode.

In FIG. 6, a preferred embodiment of the invention is illustrated when operated in DL mode. As in the EER-mode, the output signals of the outphasing splitter device is blocked by the mode switching block 104. The baseband signal, defined as $S_{in}(t)=Re\{I+jQ\}$, is in the same way as in the other two above described methods split into an amplitude component and a phase difference part by the IQ-to-Amplitude/phase conversion block 102. The amplitude component is forwarded by the EDLS 105 via the first output 105A, but controls the bias of the dynamic load devices 109, 110 in the two amplifier branches 113, 114. As when the amplifier system is operated in EER mode, the complex phase modulator 107 generates from said phase difference part a complex phase modulation signal that is transferred to the first 106E and second output port 106F of the POS 106 and further introduced in each power amplifier branch 113, 114. If the output signal from the adder is defined as $S_{OUT}(t)$, and the gain of each power amplifiers is G, the output $S_{OUT}(t)$ may be described as:

$$S_{OUT}(t)=2\cdot E(t)\cdot G\cdot Ph(t)=A\cdot Re\{e^{j(\omega t+\phi)}\}=A' \cos(\omega t+\phi),$$

wherein A' is equal to the amplified amplitude modulation coefficient, E(t) is the amplitude component and Ph(t) is the phase component.

In the above described embodiment, two different threshold values and three different amplification techniques are used. However, it shall be understood that the present invention is not limited to said number and set of threshold values and amplification techniques. Additional threshold values and/or other amplification techniques may be as well introduced within the scope of the claimed invention.

The present invention is preferably adapted for use in radio terminals, e.g. mobile radio terminals or base stations of cellular mobile radio telecommunications systems, or within satellite systems.

Figure 7:
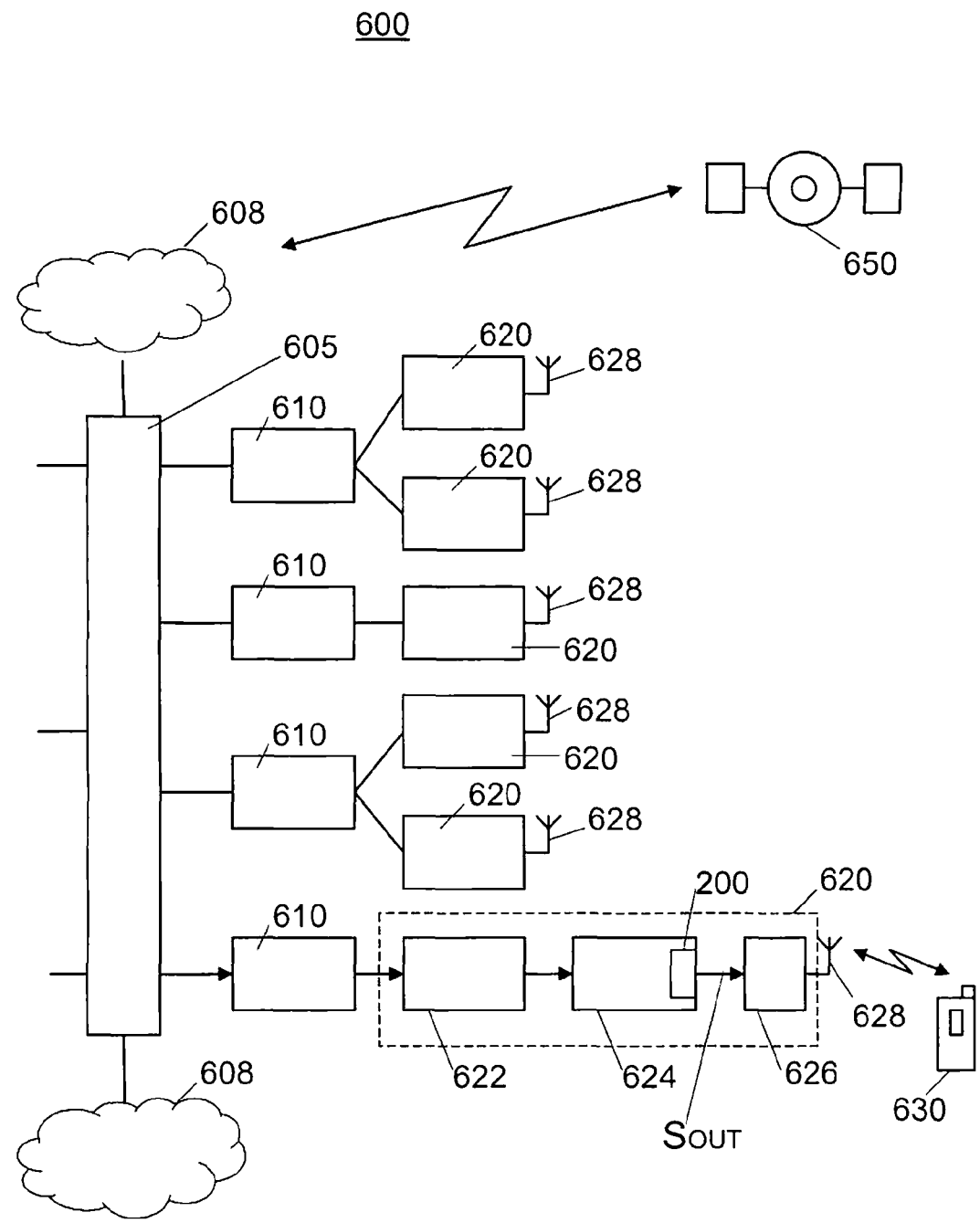
FIG. 7 is a block diagram illustrating a base station configuration comprising the amplifier system according to the invention.

FIG. 7 is a schematic illustration of a WCDMA network architecture 600 comprising base stations 620, node B. The network comprises a Core network 605 to which a number of Radio Network Controllers 610 (RNC) are connected and other networks 608, e.g. Public Switched Telephony Network (PSTN), Public data Networks. Internet, Integrated Services Digital Network (ISDSN), other Public Land Mobile Networks (PLMN), Satellite telecommunication systems, etc. The RNC 610 controls at least one dedicated node B 620 (Base Station in GSM networks). The RNC 620 controls and handles the uplink and downlink communications over the air interface between a node B 620 (connected to the RNC) and subscriber units, such as radio handset terminals 630. A node B comprises, among other units (not shown), Base Band units 622, Radio Units 624, Filter Units 626 and an antenna system 628. The Base Band unit 622 transforms digital messages into I and Q vectors, which are transferred to the Radio Unit 624. In the Radio Unit, said vectors are modulated on carriers resulting in signals $S_{in}$. Before transmission, the signals $S_{in}$ are power amplified. Therefore, the Radio Unit is equipped with at least one composite power amplifier system 200 according to the invention. The amplifier system 200 power amplifies $s_{in}$ and provides an output signal $S_{OUT}$ to the antenna system 628 for transmission over a radio channel to a subscriber unit 630. e.g. a radio terminal handset.

It is also possible to use the composite power amplifier system 200 according to the invention in a satellite 650 for mobile radio telecommunications or in mobile radio terminal, also denoted handset, for mobile radio telecommunications. The satellite will then operate as a repeater station comprising transmitters and/or transceivers in the Radio Units 624 and antenna systems 628 for handling the communication with a control station in a Satellite telecommunication systems 608 and satellite radio terminals 630 located on the earth.

Figure 8:
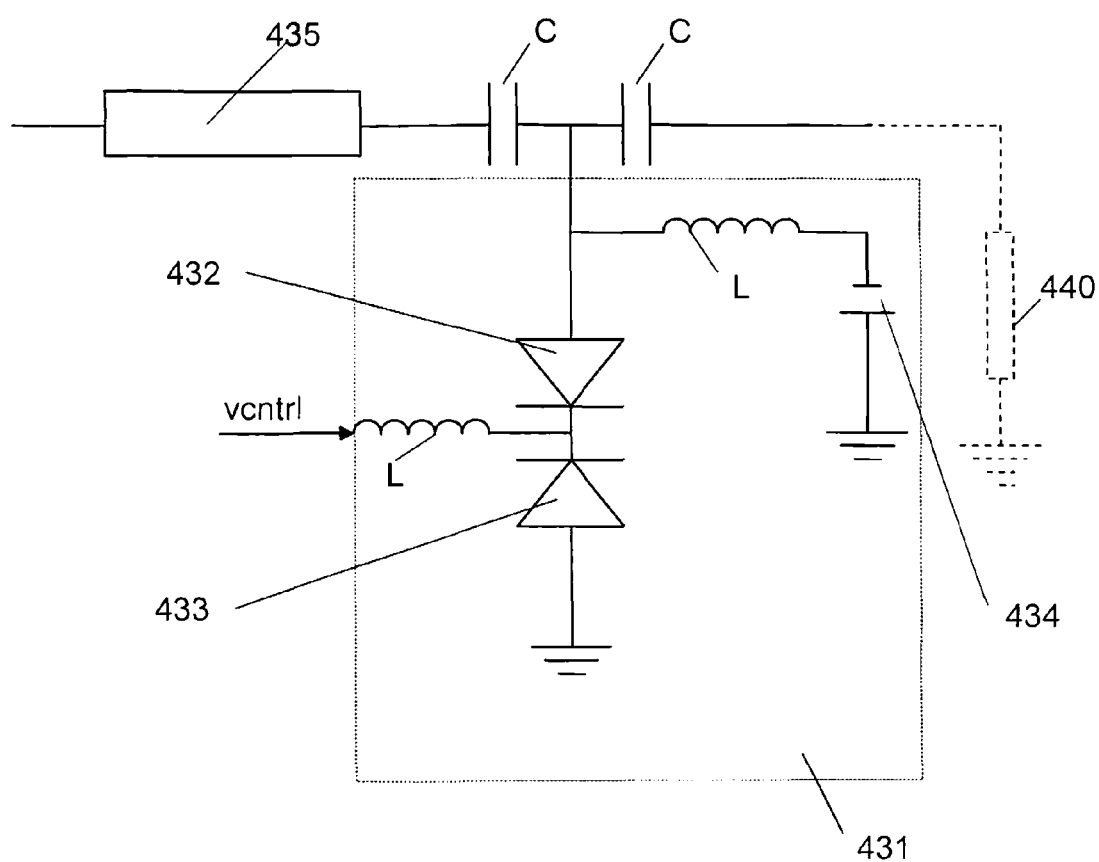
FIG. 8 is a block diagram showing a dynamic load modulation device.

An embodiment of a dynamic load device 109, 110 implemented as a lossless impedance tuner 430 is presented in FIG. 8, which is a circuit diagram. The use and control of impedance tuners are earlier known to a person skilled in the art, for example from the document "High-Efficiency Linear Amplification by Dynamic Load Modulation" by Frederick H. Raab, pp. 1717-1720, 2003 IEEE MIT-S Digest. The present impedance tuner 430 is a tunable filter arrangement, which comprises a transmission line 435 with a constant impedance $Z_0$ and an diode arrangement 431. The diode arrangement comprises two diodes 432 and 433, here varactor diodes, which cathodes are connected, as illustrated in the figure. Both diodes are charged in the reverse direction, the first diode by a DC bias source 434 and the second diode by earth potential. Their cathodes are connected to an input for a control voltage $v_{cntrl}$ that will be able to control the diode capacitance of the diodes. By controlling the diode capacitances, it is possible to adjust the impedance to compensate for the reactance effect depending on the current power level and achieve a pure optimal resistive load at each power level. In this embodiment, the input control voltage $v_{cntrl}$ is received from the first output 105B of the EDLS 105.

Figure 9:
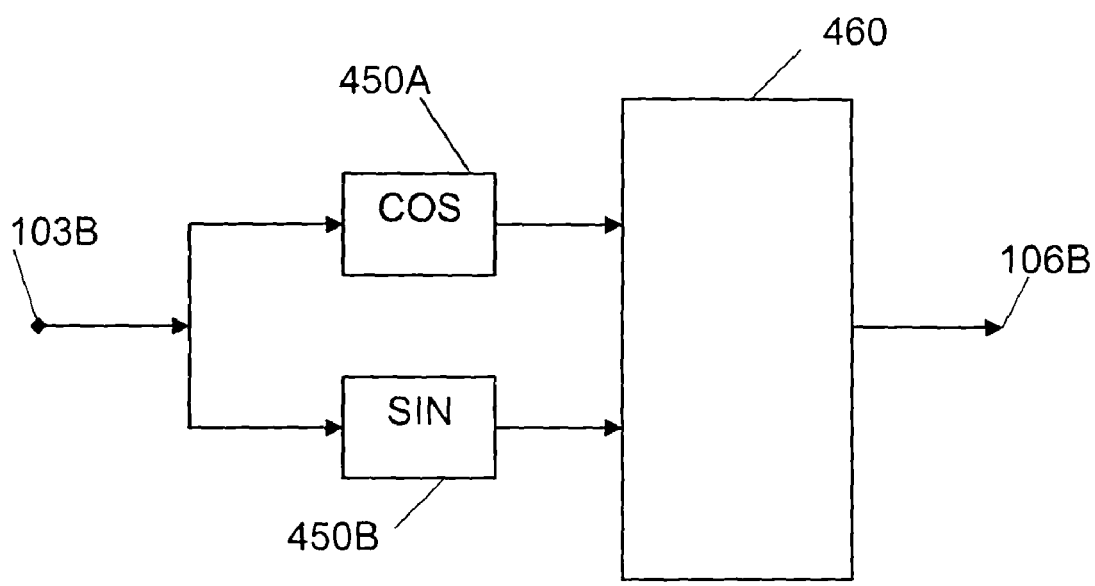
FIG. 9 is a block diagram schematically illustrating a complex phase modulator for use in the present invention.

In FIG. 9, a complex phase modulator 107 is illustrated. The momentary phase difference φ generated by the IQ-to-Amplitude/phase conversion block and DPD block arrangement 102-103, irrespective of the individual order of said two blocks, is received on the second input port 106B of the POS 106. The second input port 103B is connected to the output of a complex phase modulator 107, which complex phase modulator 107 generates, from the inserted phase difference φ, a complex phase modulation signal $e^{j\phi}=\cos\phi+j\sin\phi$ that is transferred both to the first output port 106E and the second output port 106F of the POS 106 when the amplifier system is operated in EER mode and DL mode. The phase difference signal φ is split and fed to a cosine signal generator 450A and sine signal generator 450B, respectively. The cosine signal and sine signal is fed in parallel to a Complex converter block 460, which output complex phase modulation signal $e^{j\phi}$ is transferred to the second input port 106B of the POS 106.

An implementation of the switching block(-s) is illustrated in FIGS. 10A-10C, which are schematic block diagrams showing an implementation of the EDLS 105 and POS 106 of the mode switching block 104 (see FIG. 2) in the three different modes, respectively, according to the invented method as described in FIG. 2.

The upper switching block, EDLS 105, selects whether the envelope is to be sent to the dynamic load modulation means 109 and 110, i.e. DL mode operation, or to be sent to control the gate directly of the power amplifiers 111 and 112 according to EER mode operation. The lower switching block, POS 106, controls if the two outphasing signals in outphasing operation mode shall be sent to the two power amplifiers 111 and 112, or if the phase modulated RF-signal should be sent in equal proportions to the power amplifiers 111, 112 of the amplifier system.

The EER/Dynamic Load mode Switching block (EDLS) 105 has one input 105A, and two output ports 105B and 105C. As described in the description in connection with FIG. 2, the EDLS 105 receives on input 105A the momentary amplitude value E generated by the IQ-to-Amplitude/phase conversion block 102 and DPD block 103 arrangement irrespective of the individual order of said two blocks. The EDLS comprises switching devices 202, 204, and 206, each one having a voltage control port 205. The control port 205 of this first switching device 202 is connected input 105A. The switching device 202 will switch between the two inputs 202A and 202B depending on if the envelope value E exceeds threshold value TH1 or not. Input 202A is connected to input port 105A, and input port 202B is connected to a unit amplitude voltage supply 212. The output 202C is connected to the control port 205 of the two second switching device 204 and 206, respectively, wherein switching device 204 is connected to output port 105B and switching device 206 is connected to output port 105C. The switching device 204 and 206 will switch between inputs 204A or 204B, and 206A or 206B, respectively, depending on if the envelope value E exceeds threshold value TH2 or not.

In the illustrated embodiment, the first input port 204A of switching device 204 and second input port 206B of switching device 206 are connected to the output port 202C of the first switching device 202. The second input port 204B of switching device 204 and first input port 206A of switching device 206 are connected to the unit amplitude voltage supply 212. Depending on if E exceeds TH2 or not, the two second switching device 204, 206 will switch simultaneously and forward the actual amplitude value E on the first output port 105B in DL mode when E>TH2, as illustrated in FIG. 10C and FIG. 6, and on the second output port 105C in EER mode when E<TH2, as illustrated in FIG. 10B and FIG. 5, but blocks said amplitude value E and forward a predetermined control value on both output ports 105B, 105C in Outphasing mode as illustrated in FIG. 10A and FIG. 4.

However, in another embodiment of the invention that is not illustrated, but easily understood, the two second switching device 204, 206 may switch simultaneously and forward the actual amplitude value E on the second output port 105C and allow the amplifier system to operate in DL mode when E<TH2, and on the first output port 105B allow the amplifier system to operate in EER mode when E>TH2. Output port 105C is in this embodiment connected to the dynamic load device 109, 110, and Output port 105B is connected to the amplifier pairs 111, 112.

The Phase modulation/Outphasing mode Switching block (POS) 106 has four input ports 106A-106D and two output ports 106E-106F. As illustrated in FIG. 2, the momentary amplitude value generated by the IQ-to-Amplitude/phase conversion block and DPD block arrangement 102-103 irrespective of the individual order of said two blocks is received on the first input port 106A of the POS 106. Thus, both the POS and the EDLS are connected to the output port 103A of the IQ-to-Amplitude/phase conversion block and DPD block arrangement. The second input port 106B is connected to the output of a complex phase modulator 107, which generates a complex phase modulation signal that is transferred both to the first output port 106E and the second output port 106F of the POS when the amplifier system is operated in EER mode and DL mode. For achieving operation in the Outphasing mode, the third 106C and fourth input 106D of the POS 106 are connected to a Outphasing split block 108.

The first output port 106E of the POS 106 is connected to a first power amplifier branch 113, and the second output port 106F is connected to a second power amplifier (PA) branch 114.

The POS 106 comprises a first switching device 208 and a second switching device 210. The control voltage ports 205 of said switching device are both connected to input port 106A of the POS 106. The first switching device 208 will switch between the two inputs 208A and 208B depending on if the envelope value E exceeds threshold value TH1 or not. The second switching device 210 will simultaneously switch between the two inputs 210A and 210B depending on if the envelope value E exceeds threshold value TH1 or not. Both the first input 208A of switching device 208 and the first input 210A of the second switching device 210 is connected to the second input port of the POS 106. The second input 208B of the first switching device 208 is connected to the third input 106C of the POS 106 and the second input 210B of the second switching device 208 is connected to the fourth input 106D of the POS 106.

In the Outphasing mode, when E is less (or equals) TH1, the first output 106E is connected to the third input 106C and second output 106F of the POS 106 is connected to the fourth input 106D as illustrated in FIG. 10A and FIG. 4. When E exceeds threshold TH1, the switching device simultaneously switches, and the complex phase modulation signal is transferred both to the first output port 106E and the second output port 106F of the POS when the amplifier system is operated in EER mode, see FIG. 10B and FIG. 5, and DL mode, see FIG. 10C and FIG. 6, respectively.

It is possible to adjust and pre-set the threshold values TH1 and TH2 of the switching device to any wished value.

In the description of the invented system, a number of control signals, or control values, are handled by the mode switching block 105. The value E(t) is used as input signal on input 105A of the EDSL 105 of the mode switching block 104. The relation to the input signal S(t) may be defined as $E(t)=abs(S(t))=A(t)$, if the input signal S(t) is a complex baseband signal defined as $S(t)=A(t)*e^{j\Phi(t)}$, wherein A(t) is the signal amplitude, $A(t)>0$. If the system gain is G, the output signal of the system is $S_{out}(t)=G*S(t)$.

The EDSL 105 is also capable of generating two control signals, $V_{DL}$ on output 105B and $V_{EER}$ on output 105C. $V_{DL}$ is the control value for the load tuners 109, 110 and it corresponds to a vector length $abs(S_{out})$. $V_{EER}$ is the control value for the PAs 111, 112 and it also corresponds to a vector length $abs(S_{out})$.

The phase difference $\theta$ between the phase signals on the inputs 106C and 106D will vary between $\theta_{min}=180$ and $\theta_{max}=0$ depending on the complex baseband input signal S(t). $\theta_{min}$ is the phase difference that corresponds to a minimum $abs(S_{out})$. $\theta_{max}$ is the phase difference that corresponds to a maximum $abs(S_{out})$.

The control signals are digital signals and are therefore converted by the DACs 156 and 157, respectively.

TH1 is set to level N1 and TH2 is set to level N2, where N1, N2>0 and N2>N1. The two levels are defining the three amplification intervals—first, second and third amplification intervals. The first interval is defined as $0 \leq E(t) \leq N1$ (or $0 \leq E(t)<N1$), the second amplification interval is defined as $N1<E(t) \leq N2$ (or $N1 \leq E(t) \leq N2$ or $N1<E(t)<N2$ or $N1 \leq E(t)<N2$) and the third amplification interval $E(t)>N2$ (or $E(t) \geq N2$).

The values $V_{DL}$, $V_{EER}$, and $\theta$ of said control signals when E(t) is varying (the column to the left) is shown in Table 1.

TABLE 1

| E(t) | $V_{DL}$ | $V_{EER}$ | θ |
|------|----------|-----------|---|
| 0    | 1        | 1         | 180 |
| .    | 1        | 1         | . |
| .    | 1        | 1         | . |
| .    | 1        | 1         | . |
| N1   | E(t)     | 1         | 0 |
| .    | E(t)     | 1         | 0 |
| .    | E(t)     | 1         | 0 |
| .    | E(t)     | 1         | 0 |
| N2   | 1        | E(t)      | 0 |
| .    | 1        | E(t)      | 0 |
| .    | 1        | E(t)      | 0 |

Therefore, in the first amplification interval, i.e. $0 \leq E(t) \leq N1$ (or $0 \leq E(t)<N1$), when the outphasing technique is used, the phase difference θ between the phase signals on the inputs 106C and 106D will vary between $\theta_{min}$ and $\theta_{max}$, and $V_{DL}$ on output 105B is set to a unit value "1" and $V_{EER}$ on output 105C is also unit value "1".

In the second amplification interval, i.e. $N1<E(t) \leq N2$ (or $N1 \leq E(t) \leq N2$ or $N1<E(t)<N2$ or $N1 \leq E(t)<N2$), when the EER amplification is used, the phase difference θ is set to $\theta_{max}$, and $V_{DL}$ on output 105B is varying with or depending on E(t) and $V_{EER}$ on output 105C is set to the unit value "1".

In the third amplification interval, i.e. $E(t)>N2$ (or $E(t) \geq N2$), when the DL amplification is used, the phase difference θ is still $\theta_{max}(=0)$, and $V_{DL}$ on output 105B is set to the unit value "1", $V_{EER}$ on output 105C is varying with or depending on E(t).

Another possible implementation (not shown) of the switching block(-s), i.e. the mode switching block 104 or the EDLS 105 and POS 106, is to use a Look-up-Table arrangement comprising storage means storing predetermined control values corresponding to current envelope values.

As stated above in the description, the invention provides the possibility to use more threshold values than two. The invention also provides possibility to operate the amplification system in more than three modes. In such other modes, the system is operated according to a combination of at least two of the stated amplification techniques outphasing, DL or EER.

The present invention may be embodied in many different forms and should not be construed as limited to the embodiments set forth herein: rather, these embodiments are provided so that this disclosure will be thorough and complete, and will fully convey the scope of the invention as defined by the enclosed set of claims.

The invention claimed is:

1. A method for power amplifying an input drive signal to a power amplification system comprising at least three different power amplification modes, where each power amplification mode is dedicated to operate within a pre-determined amplification interval, the method comprising:
   determining a momentary envelope value (E) of the input drive signal ($S_{in}$); and
   switching amplification mode to one of the at least three different amplification modes depending on the determined momentary envelope value (E), where the switching comprises:
   operating the power amplification system in a first amplification mode if the momentary envelope value (E) is determined to be within a first amplification interval, and when the power amplification system is operated in the first amplification mode, an outphasing technique is used for power amplifying the input drive signal;
   operating the power amplification system in a second amplification mode if the momentary envelope value (E) is determined to be within a second amplification interval; and
   operating the power amplification system in a third amplification mode if the momentary envelope value (E) is determined to be within a third amplification interval.

2. The method according to claim 1, where when the power amplification system is operated in the second amplification mode, a Dynamic Load modulation technique is used for power amplifying the input drive signal.

3. The method according to claim 1, where when the power amplification system is operated in the second amplification mode, an Envelope Elimination and Restoration (EER) technique is used for power amplifying the input drive signal.

4. The method according to claim 1, where when the power amplification system is operated in the third amplification mode, an Envelope Elimination and Restoration (EER) technique is used for power amplifying the input drive signal.

5. The method according to claim 1, where when the power amplification system is operated in the third amplification mode, a Dynamic Load technique is used for power amplifying the input drive signal.

6. A power amplifying system for power amplifying an input drive signal to the power amplifying system, where the power amplifying system operates in at least three different power amplification modes, where each amplification mode is dedicated to operate within a pre-determined amplification interval, the power amplifying comprising:
   a determining device for determining a momentary envelope value (E) of the input drive signal; and
   a switching amplification mode device for switching to one of the at least three different amplification modes depending on the determined momentary envelope value (E) received from the determining device, where the switching amplification mode device comprises:
   a switching device for switching the power amplifying system to:
   a first amplification mode if the momentary envelope value (E) is determined to be within a first amplification interval,
   a second amplification mode if the momentary envelope value (E) is determined to be within a second amplification interval, and
   a third amplification mode if the momentary envelope value (E) is determined to be within a third amplification interval,
   where if the power amplifying system is operated in the first amplification mode, an outphasing technique is used for power amplifying the input drive signal.

7. The power amplifying system according to claim 6, where if the power amplifying system is operated in the second amplification mode, a Dynamic Load modulation technique is used for power amplifying the input drive signal.

8. The power amplifying system according to claim 6, where if the power amplifying system is operated in the third amplification mode, an Envelope Elimination and Restoration (EER) technique is used for power amplifying the input drive signal.

9. The power amplifying system according to claim 6, where if the power amplifying system is operated in the second amplification mode, an Envelope Elimination and Restoration (EER) technique is used for power amplifying the input drive signal.

10. The power amplifying system according to claim 6, where if the power amplifying system is operated in the third amplification mode, a Dynamic Load technique is used for power amplifying the input drive signal.

11. The power amplifying system according to claim 6, where a radio base station in a mobile radio telecommunication network, includes the power amplifying system.

12. A switching amplification mode device in a power amplifying system for power amplifying an input drive signal to the power amplifying system, where the switching amplification mode device operates in at least three different power amplification modes, where each amplification mode is dedicated to operate within a pre-determined amplification interval, the switching amplification mode device comprising:
- a determining device for determining a momentary envelope value (E) of the input drive signal, and
- a switching mode device for switching the power amplifying system to operate in one of the at least three amplification modes depending on the momentary envelope value (E) received from the determining device, where the switching mode device switches the power amplification amplifying system to:
  - a first amplification mode if the momentary envelope value (E) is determined to be within a first amplification interval,
  - a second amplification mode if the momentary envelope value (E) is determined to be within a second amplification interval, and
  - a third amplification mode if the momentary envelope value (E) is determined to be within a third amplification interval,
  - where if the power amplifying system is operated in the first amplification mode, an outphasing technique is used for power amplifying the input drive signal.

13. The switching amplification mode device according to claim 12, where if the power amplifying system is operated in the second amplification mode, a Dynamic Load modulation technique is used for power amplifying the input drive signal.

14. The switching amplification mode device according to claim 12, where if the power amplifying system is operated in the third amplification mode, an Envelope Elimination and Restoration (EER) technique is used for power amplifying the input drive signal.

15. The switching amplification mode device according to claim 12, where if the power amplifying system is operated in the second amplification mode, an Envelope Elimination and Restoration (EER) technique is used for power amplifying the input drive signal.

16. The switching amplification mode device according to claim 12, where if the power amplifying system is operated in the third amplification mode, a Dynamic Load technique is used for power amplifying the input drive signal.

17. The switching amplification mode device according to claim 12, where the power amplifying system comprises amplifiers.

18. The switching amplification mode device according to claim 17, where the amplifiers are one or more of amplifier classes B, C, D, E, E/F, or F.

* * * * *